United States Patent [19]
Ignasiak

[11] Patent Number: 4,841,100
[45] Date of Patent: Jun. 20, 1989

[54] EXPANDING SURFACE MOUNT COMPATIBLE RETAINER POST

[75] Inventor: Martin C. Ignasiak, Mentor, Ohio

[73] Assignee: Minnesota Mining and Manufacturing Company, St. Paul, Minn.

[21] Appl. No.: 92,063

[22] Filed: Sep. 2, 1987

[51] Int. Cl.$^4$ .............................................. H05K 1/18
[52] U.S. Cl. ......................... 174/138 G; 174/DIG. 8; 174/68.5; 361/400; 361/417; 361/419; 403/29; 403/30; 411/909
[58] Field of Search ..................... 174/138 G, DIG. 8; 361/400, 417, 419; 403/28, 29, 30, 274, 31; 411/909, 901, 902, 903, 913

[56] References Cited

U.S. PATENT DOCUMENTS

| | | | |
|---|---|---|---|
| 2,994,933 | 8/1961 | Wolfe | 174/DIG. 8 X |
| 3,184,532 | 5/1965 | Spera | 174/138 G |
| 3,354,260 | 11/1967 | Brandt et al. | 174/DIG. 8 X |
| 3,569,901 | 3/1971 | Connor | 411/909 X |
| 4,216,697 | 8/1980 | Wilson | 411/39 X |
| 4,232,712 | 11/1980 | Squires | 403/30 X |
| 4,462,651 | 7/1984 | McGaffigan | 174/DIG. 8 X |
| 4,482,277 | 11/1984 | Schiefer | 411/39 X |
| 4,544,802 | 10/1985 | Siden | 174/DIG. 8 X |
| 4,566,183 | 1/1986 | Bloom et al. | 174/DIG. 8 X |
| 4,587,377 | 5/1986 | Rodseth | 174/138 G X |
| 4,602,125 | 7/1986 | West et al. | 174/138 G |
| 4,646,203 | 2/1987 | Ngo et al. | 361/388 |
| 4,650,385 | 3/1987 | Jackson et al. | 403/29 X |

Primary Examiner—R. R. Kucia
Attorney, Agent, or Firm—Renner, Otto, Boisselle & Sklar

[57] ABSTRACT

A retainer post for tightly engaging a printed circuit board employing surface mounted technology. The retainer post has a hollow neck portion for insertion in a hole in a printed circuit board, an adjoining shoulder section for engaging the surface of the printed circuit board and, preferably, a retaining means for retaining said post in the printed circuit board. The retaining means preferably is formed of a circumferential, radially projecting barb containing longitudinal notches so that it may be inwardly compressed as the retaining post is inserted in a hole in a printed circuit board. The neck section contains a plurality of longitudinal spaced (i) grooves on its outer surface forming opposing frangible webs or (ii) cuts through said neck section. The neck section contains a cavity in which is disposed a material that expands upon heating. Expanding materials include shape memory effect alloys, such as nitinol, and a structure in which a material having a relatively high thermal coefficient of expansion is coated with a material having a lower thermal coefficient of expansion. Upon heating a retainer post in a vapor phase soldering step, the expanding material creates an internal bursting pressure that expands portions of the neck section. The portions are defined by the longitudinal cuts or by the webs that are fractured by the bursting pressure. The expanded neck portions tightly engage the printed circuit board through which the retainer post is inserted. A stable mechanical contact between the post and circuit board is achieved so that the retainer post may be used to attach electrical connectors and other components to the printed circuit board without threatening the integrity of electrical connections.

19 Claims, 1 Drawing Sheet

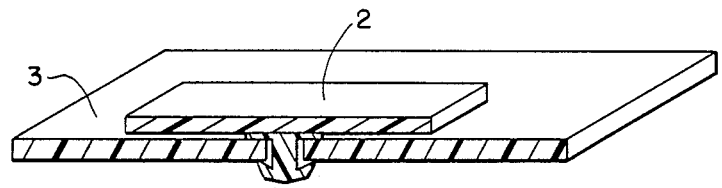
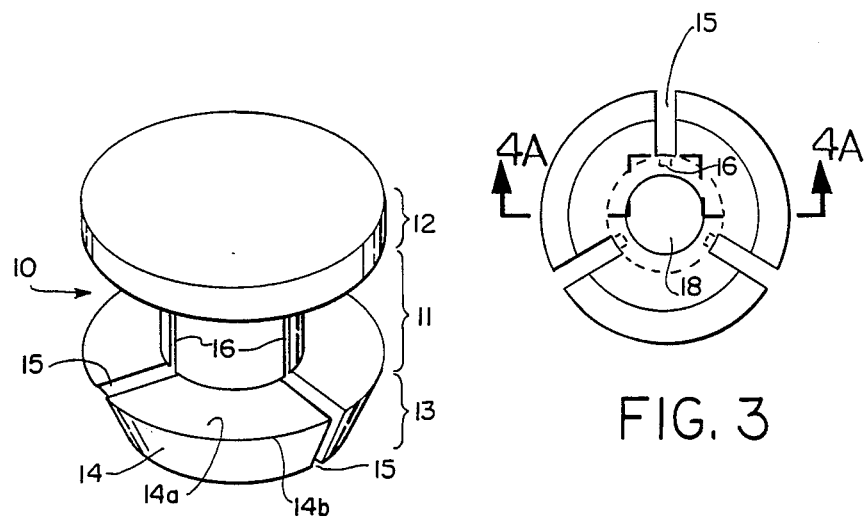
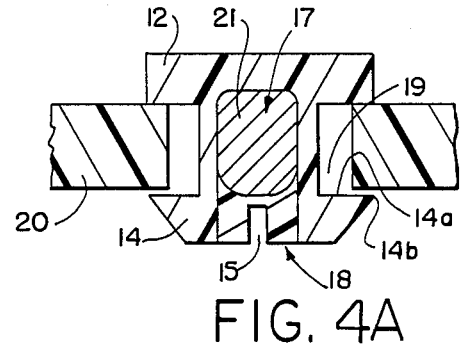
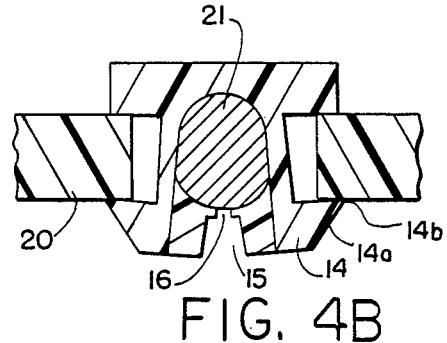

EXPANDING SURFACE MOUNT COMPATIBLE RETAINER POST

BACKGROUND

This invention relates generally to surface mount technology electrical component printed circuit board apparatus and processes and, particularly, to an expanding retainer post for use with printed circuit boards employing surface mount technology and/or with electrical components intended to be attached to a printed circuit board or the like, for example during a surface mount process.

In surface mount technology (sometimes referred to simply as surface mount), electrical components are mounted directly to the surface of a printed circuit board, usually without any contacts or leads penetrating through the printed circuit board. Surface mount technology increases the space utilization efficiency of printed circuit boards and generally reduces the height of components above a board, allowing more printed circuit boards to be stacked or otherwise positioned in a given volume.

In typical surface mount processes, the printed circuit board has circuit traces and contact or mounting pads disposed on one or both of its surfaces. A surface mount electrical component, e.g. a chip carrier, having a plurality of leads or terminal pads, is placed on the board so that the leads or terminal pads touch the contact or mounting pads. Solder has been applied to those leads, terminal pads and/or contact or mounting pads prior to the placement of the components on the board. After all the components are placed on the printed circuit board, thermal energy is applied to "reflow" the solder. Heat may be supplied by an infrared source or by the process known as vapor phase soldering to establish permanent electrical and mechanical connections between the component(s) and the contact or mounting pads and traces on the printed circuit board. Sometimes an adhesive material is used temporarily to hold components in position on the printed circuit board prior to and during the soldering process.

Electrical connectors have been mounted directly to the surface of the printed circuit board in substantially the same way as the other surface mount components are mounted in order to establish all electrical connections at the same time, in the same mounting process. An example of an electrical connector used in surface mount technology is called a header, which is a plurality of electrical contacts retained in a fixed position relative to each other by an engaging, electrically non-conductive body. Header contacts are typically elongated pins having ends that are exposed at opposite sides, e.g., the top and bottom, of the body.

Another method of mounting a connector or other component to a printed circuit board uses retainer posts, usually made of a plastic, that are mounted in holes in the printed circuit board. The retainer posts generally include resilient barbs or other retractable retaining means. The post is inserted into a hole in a printed circuit board under pressure to engage the retaining means in an interference fit with the printed circuit board. The retainer posts can then receive screws, rivets or other fasteners, to hold a connector or other component to the printed circuit board.

If conventional printed circuit retainer posts are used in surface mount technology processing, they can be damaged by the temperatures used in the soldering step. In the typical vapor phase soldering step, temperatures can reach 400° to 450° F. (220° to 235° C.), causing shrinkage of the retainer posts and printed circuit board. That is, a printed circuit board hole increases in size, resulting in a loose fit between the board and the retainer post. This loose grip means that items, such as connectors, attached to the retainer posts can move relative to, and in the plane of, the printed circuit board threatening the integrity of electrical connections to surface mounted components and reliability. The loose mechanical connection can also make the printed circuit board susceptible to incorrect insertion in a connector. Nevertheless, retainer posts have considerable utility since they permit mechanical mounting of a wide variety of items on a printed circuit board.

Accordingly, it is desirable to provide a retainer post for a printed circuit board that is suitable for use with surface mount component technology, and that can withstand the temperature of vapor phase soldering without the loss of, and preferably with an improvement in, the security of the mechanical connection between the retainer post and the printed circuit board in which the post is installed.

SUMMARY OF THE INVENTION

In accordance with the invention, a novel retainer post is provided that is suitable for holding an electrical component, such as a chip carrier, header or other electrical, electronic or like device, in position with respect to a printed circuit board or the like. More particularly, such retainer post preferably responds to the temperatures encountered during surface mount solder reflow processes, such as vapor phase soldering, by expanding to engage the printed circuit board tightly and preferably to hold the component thereto. Moreover, that holding function preferably commences during elevated temperature conditions at which the solder reflows and continues even after subsequent cooling.

A preferred embodiment of the new retainer post includes a body formed of a resilient, plastic material that can withstand at least about 425° F. without losing dimensional stability. The body preferably can be attached to or formed as part of the packaging of an electrical component, for example a component that is intended to be attached to a printed circuit board or the like. The body includes a hollow neck section for insertion into a hole in a printed circuit board. In a discrete post, a shoulder section adjoins the neck section for engaging the printed circuit board and preventing the post from falling through the hole. In a post according to the invention that is part of or is attached to the packaging of a component, the package forms a shoulder section. Preferably, a resilient retaining means, such as a circumferential, radially extending shoulder or barb depends from the neck section opposite the shoulder section. Typically, a radially extending barb has a larger diameter than the hole in the printed circuit board. To enable insertion of the barb through the hole, the barb preferably includes a plurality of longitudinally disposed notches cut through the barb. The notches permit compression of the resilient barb so that it can be inserted through a hole in the printed circuit board.

The neck section of the retainer post preferably has a smaller diameter than that of a hole in the printed circuit board with which the post is to be used. A plurality of expansion means are disposed on a surface of the neck section to permit its expansion on the application of sufficient internal pressure. After expansion, the neck section tightly engages the wall of the surrounding hole in the printed circuit board. Alternatively or additionally the shoulder or barb may engage the surface of the printed circuit board to pull the component toward the opposite surface of the printed circuit board during and after such expansion. In any event by expanding the shoulder or barb such expanded part prevents the neck from being withdrawn back through the printed circuit board, thus holding the component to the board.

A preferred embodiment comprises a longitudinally disposed groove formed in the outside surface of the neck section, extending between the shoulder and any opposing retaining means. The thickness of the neck section wall is reduced opposite each groove to a frangible web that will fracture when subjected to sufficient outwardly directed, bursting stress exerted from within the neck section. Preferably three or more such grooves are substantially equally disposed around the circumference of the neck section. If a retaining means having a peripheral barb is present, it is preferred that the grooves and any notches in the barb are substantially aligned. An alternative embodiment comprises longitudinal cuts that pass entirely through the thickness of the hollow neck section, eliminating the webs.

The neck section is expanded by internal bursting pressure exerted by a bursting means resulting in fractures that propagate along the grooves or simply expansion permitted by cuts. The hollow neck section includes an internal reservoir, preferably a cavity accessible from outside the retainer post, that contains a material that expands sufficiently at elevated temperatures to burst the neck section of the retainer post. the bursting means may be a shape memory effect alloy, such as a nitinol, or may be a combination of materials that have substantially different thermal coeffecients of expansion. In the former case, a shape memory alloy is cast in the shape of the expanded neck, then mechanically worked to a size that fits into the cavity. Upon heating to a sufficient temperature, they alloy returns to its cast shape, bursting the neck section along its grooves or cuts. Where a memory material is used, the expanded configuration of the retainer post securely grasps the board and retains that grasp even after cooling. In the latter case, the material with the smaller thermal coefficient of expansion coats the material of a substantially higher thermal coefficient of expansion. The two component structure is disposed in the reservoir. As they are heated, the materials expand, but at different rates. Eventually, the temporarily contained thermal expansion of the inner material is suddenly released, expanding the neck section of the retainer post along the grooves or cuts. In either case, the expanded neck section tightly engages the inside surface of the hole in the printed circuit board. The expansion means is chosen to be actuated at a temperature below the highest temperature attained in a vapor soldering step.

The foregoing and other objects, features and advantages will become more apparent from the following description with reference to the drawings.

To the accomplishment of the foregoing and related ends the invention, then, comprises the features hereinafter fully described and particularly pointed out in the claims, the following description and the annexed drawings setting forth in detail certain illustrative embodiments of the invention, these being indicative, however, of but a few of the various ways in which the principles of the invention may be employed.

BRIEF DESCRIPTION OF THE DRAWINGS

In the annexed drawings:

FIG. 1 is an isometric view, partly in section, of a retainer post according to the invention holding an electrical component to a printed circuit board;

FIG. 2 is a perspective view of an embodiment of a retainer post according to the invention;

FIG. 3 is a bottom view of an embodiment of a retainer post according to the invention; and FIGS. 4A and 4B are sectional views of an embodiment of a retainer post according to the invention taken along line 4A—4A' of FIG. 3, showing the embodiment before and after the expansion step, respectively.

DETAILED DESCRIPTION OF PREFERRED EMBODIMENTS

In the accompanying figures, like elements are given the same reference numbers. The embodiments shown in the figures are not drawn to any scale.

Initially referring to FIG. 1, a retainer post 1 is shown coupling an electrical component 2 to a printed circuit board 3. Component 2 may be any of a variety of active, passive, connective, etc., devices; examples include but are not limited to LCC (leaded chip carrier) devices, headers, and so on. Retainer post 1 may be formed as part of the packaging of component 2 or may be attached thereto by some means, such as an adhesive or chemical bonding material. As used here the term "packaging" encompasses a plastic or ceramic integrated circuit package, an insulator enclosing one or more conductors and even the outer surface of a discrete component (e.g. resistor or capacitor) which may be molded or to which an adhering bond can be formed. Depending on the size of component 2 and/or the forces that it may be expected to encounter, the component may include more than the illustrated one retainer post.

In FIG. 2 an individual retainer post 10 according to the invention is shown in a perspective view. Retainer post 10 may be part of or may be retainer post 1 of FIG. 1. Retainer post 10, generally comprising the body of a resilient material, includes a hollow neck section 11 that adjoins a shoulder section 12. Shoulder section 12 is shown simply as a disk. However it may include a resilient volume for receiving a self tapping screw, a recess for accepting a rivet or another means for engaging a fastener, e.g., to secure the retainer post 1 to a component 2 or the like, as is shown in FIG. 1. The particular structure of shoulder section 12 is not essential to an understanding of the invention and so is not further described here. Neck and shoulder sections 11 and 12 are shown as having circular cross-sections, which is preferred, but not required. The cross-section of neck section 11 may be any shape that conveniently fits in a prepared hole in a printed circuit board as discussed below. Shoulder section 12 is of a larger transverse cross-sectional area than neck section 11 to prevent retainer post 1 from falling through a hole in a printed circuit board into which neck section 11 has been inserted.

Adjoining neck section 11 opposite shoulder section 12 is a retaining means 13. Retaining means 13 includes a circumferential shoulder or barb 14 radially extending from the center of retainer post 10. The term "barb" refers to the tapering cross-section of the retaining means embodiment, shown more clearly in FIG. 4A. Barb 14 has a smaller diameter at its distal end and increases in diameter toward neck section 11. Retaining means 13 also includes a plurality of longitudinally disposed notches 15. In the embodiment shown in FIG. 2, three substantially equidistant notches 15 are disposed around the circumference of retaining means 13, dividing barb 14 into three portions. Notches 15 permit the three portions of barb 14 to be compressed when retainer post 10 is inserted into a hole in a printed circuit board. Once the proximate end of barb sections 14 passes through a hole in a printed circuit board, the natural resilience of retainer post 10 causes the barbs to spring apart and lock the post in the hole, preventing its withdrawal. As shown in FIG. 4A, neck section 11 preferably fits snugly, but loosely, in a properly prepared hole in a printed circuit board. The precise width of notches 15 and dimensions of barbs 14, for a material of a particular resiliency and for a particular printed circuit board hole size, can be readily determined by one of skill in the art. The retaining means embodiment shown is but one example of many possible variations. For instance, a barb might have two or more relatively narrow sections separated by relatively wide notches and/or may not be circumferential.

Alternatively, the diameter of the barb 14 at the widest part thereof, e.g., at the shoulder surface 14a, may be less than the diameter of the hole in a printed circuit board through which the barb is to be inserted to facilitate such insertion. Thereafter, relying on the expansion described herein, such barb may be forced to expanded condition whereby the shoulder surface 14a prevents withdrawal of the same through such hole.

Retainer post 10 includes on the outside surface of its hollow neck section 11 longitudinal, radially disposed grooves 16. The grooves are referred to as longitudinal because they generally extend between shoulder section 12 and retaining means 13, along the length of post 10. The side walls of grooves 16 generally lie along planes containing radii from the central longitudinal axis of post 10. These grooves are cut into the surface of neck section 11 but do not cut entirely through its thickness to its hollow central cavity which is described below. As shown in FIG. 2, it is preferred that each of grooves 16 is aligned with one of notches 15. The reduced thickness of the wall of neck section 11 opposite each of grooves 16 forms a frangible web that can be fractured by a bursting force applied from inside neck section 11. A bursting force is a force exerted from within retainer post 10 that applies generally radially outward pressure. Grooves 16 are, therefore, one means for expanding the neck section when appropriate force is applied. As described below, neck section 11 is preferably hollow and grooves 16 mmay also be formed on the inside surface of the neck section 11. However, to facilitate the fracture of neck section 11 in response to the bursting pressure, it is preferred that grooves 16 be formed on the outside of neck section 11.

In an alternative embodiment, grooves 16 may be replaced by cuts that extend all the way through the thickness of neck section 11 to a cavity 17, described below. Cuts eliminate the frangible webs adjoining the groove and permit the bursting force described below to be expended on expanding the neck section portions that lie between each pair of grooves or cuts 16, rather than in fracturing webs.

Neck section 11 is substantially hollow as shown in FIG. 3 and in cross-section in FIG. 4A. In the retainer post embodiment illustrated, retaining means 13 includes on its outside end an opening 18 through which access to a cavity 17 within neck section 11 is obtained. Cavity 17 forms an internal reservoir for the placement of a material that expands when heated. In FIG. 4A, retainer post 10 is shown after it has been inserted in a hole 19 in a printed circuit board 20 but before the expansion step. FIG. 4B is the same cross-section as FIG. 4A, but after the expansion step. In FIG. 4A, cavity 17 contains a thermally expandable material layer 21 that contacts the inside surface of neck section 11. When post 10 is oriented as indicated in FIG. 4A, barb 14 retains post 10 in hole 19 so that material 21 cannot fall out of cavity 17. The post might be inverted and retaining means 13 might be omitted if composition 21 adheres well to post 10 or if opening 18 is covered by an adequate temporary or permanent closure.

The operation of retainer post 1 is illustrated by comparison of FIGS. 4A and 4B. After installation of the post as shown in FIG. 4A, the printed circuit board with its surface mounted components in place is subjected to a soldering process such as vapor phase soldering or heating with infrared solution. In either event, the ambient temperature is elevated to a temperature sufficient to melt solder. In conventional surface mount processes and with the solder compositions currently used, this step requires that the temperature be raised to between 400° and 450° F.

In a preferred embodiment of the invention, cavity 17 contains a material 21 that is a mass of a shape memory effect alloy. These alloys are known to attempt to return to the shape in which they are cast when heated after having been mechanically worked into a different shape. Examples of such alloys, which are well known in the material sciences, are made from copper-aluminum-nickel, copper-zinc-aluminum, titanium-cobalt-nickel and titanium nickel, with the latter alloys generally being referred to as nitinol when the titanium content ranges from 55 to 58 percent. Masses of a shape memory effect alloy are cast into shapes that would fill the shape of cavity 17 after the fractured portions of neck section 11 have been expanded, e.g. as shown in FIG. 4B. These masses are then mechanically worked to fit within cavity 17 of a virgin retainer post, e.g. as shown in FIG. 4A. The post is installed in a printed circuit board and during the soldering step, as the temperature reaches the temperature at which the alloy attempts to return to its original shape, neck section 11 is fractured along grooves 16. The fracturing expands the separated portions of neck section 11 to engage printed circuit boards 20. Preferably the outward force spreads the fractured portions of neck 11 so that they tightly engage printed circuit board 20. When cuts are substituted for grooves 16, no webs need to be fractured. The bursting pressure is spent on spreading the separate portions of neck section 11 so that they tightly engage printed circuit board 20. In any event, the pressure preferably at least initially is exerted at a temperature below the solder melting point, i.e. below 400° to 450° F.

Such tight engaging of the printed circuit board 20 may be achieved by wall surfaces of the neck 11 frictionally engaging wall surface in and bounding the hole 19 in the board and/or by the expanded shoulder/barb 14. Additionally or alternatively, the shape of the shoulder/barb 14 may be such that upon expansion there needs to be a pivoting thereof such that the distal edge 14b thereof engages the underside of the board 20 (as seen in FIGS. 1 and 4B) and pulls the component 2 toward the top or opposite surface of the board.

In an alternate embodiment, material 21 is replaced by two materials chosen to have substantially different coefficients of thermal expansion. One such material preferably has a much larger coefficient of thermal expansion than the other material. The smaller coefficient of expansion material preferably surrounds or encases the former material. When these materials are heated, substantial internal pressure is created by the attempted expansion of the inner material until that pressure is released by the yielding of the outer material. The difference in thermal expansion coefficients permits the pressure created in the composite to build before it is rapidly released. When that pressure is released, it is sufficient to fracture the webs adjoining each of grooves 16 and to push outwardly the then-severed portions of neck section 11 that lie between each pair of grooves 16.

The two specific embodiments of the bursting means described both preferably operate in a rapid, "snap" action. That is, after some initial period of heating, the force of the bursting means preferably operates rather suddenly to fracture the webs adjoining grooves 16 and to push out the neck section portions and barbs 14 securely to engage or to grasp the printed circuit board tightly. The grasping preferably pulls neck 12 or component 2 toward board 20 or 3, respectively. Component 2 is held to board 3 by post 10 at least during reflowing of the solder in a surface mount attaching process. Preferably, when using memory material 25, such as nitinol, that material maintains the expanded shape even after cooling, so that retainer post 1 will continue to tend to hold component 2 against board 3 after the soldering step.

While the embodiment of the retainer post illustrated has three grooves or cuts 16 substantially equally spaced around the circumference of neck section 11, and therefore three expandable portions of neck section 11, the invention is not so limited. Preferably, there should be at least two such grooves or cuts in order to provide good mechanical security between the expanded post and the printed circuit board. The upper limit on the number of such grooves or cuts is determined by the space available on the neck section and the effective use of the available bursting force. The body of a retainer post according to the invention may be formed from a plastic by injection molding or another forming process. As is understood by those of skill in the art, the body can be molded as a unitary item containing grooves and notches and requiring no further cutting or working after the molding. It is preferred that the forming process leave a residual stress in neck 11 that acts in the same direction as a bursting force. This residual force aids the expansion means in bursting neck section 11. It is likewise preferred that the expansion means be placed in direct contact with the inside surface of cavity 17, as shown, to use the burst force effectively. However, some space may be allowed between cavity walls 17 and the expansion means, if desired and the amount of expansion permits.

The invention has been described with respect to certain preferred embodiments. Various modifications within the spirit of the invention will occur to those of skill in the art. Accordingly, the scope of the invention is limited solely by the following claims.

I claim:

1. A retainer post for insertion in a hole in a printed circuit board in order to mount a device to such board, comprising:

a resilient body including a neck section insertable in a printed circuit board, a shoulder section means adjoining said neck station for engaging the surface of a printed circuit board to prevent said body from passing completely through such a hole, said neck section being diametrically expandable in response to internal bursting pressure applied to said neck section, a bursting means for expanding in response to an increase in temperature to expand said neck section to cause the retainer post to engage a printed circuit board in which it is inserted, and reservoir means for retaining said bursting means, said reservoir means being disposed within said neck section.

2. The retaining post of claim 1 including retaining means depending from said neck section opposite said shoulder section means for retaining said post in a hole in a printed circuit board.

3. The retainer post of claim 2 wherein said retaining means comprises a barb radially extending from said body.

4. The retainer post of claim 2 wherein said retaining means comprises a circumferential barb radially extending from said body.

5. The retainer post of claim 4 wherein said circumferential barb contains at least two substantially longitudinally disposed notches in said barb.

6. The retaining post of claim 1 further comprising a plurality of substantially longitudinally disposed grooves creating a frangible web in said neck section to permit diametric expansion when the internal bursting pressure is sufficient to fracture said frangible web.

7. The retainer post of claim 2 wherein said retaining means comprises a circumferential barb radially extending from said body and having a plurality of longitudinally disposed notches in said barb and further comprising a plurality of substantially longitudinally disposed grooves forming a web in the outer surface of said neck section and wherein a said groove is aligned with each of said notches to permit diametric expansion when the internal bursting pressure is sufficient to fracture the frangible web.

8. The retainer post of claim 1 further comprising a plurality of longitudinally disposed cuts through said neck section to permit diametric expansion when said internal bursting pressure is sufficient to expand the neck section portions that lie between each pair of cuts.

9. The retainer post of claim 2 wherein said retaining means comprises a circumferential barb radially extending from said body and having a plurality of longitudinally disposed notches in said barb and further comprising a plurality of substantially longitudinally disposed cuts through said neck section and wherein respective cuts are aligned with respective notches to permit predominantly diametric expansion when the internal bursting pressure is sufficient to expand the neck section portions that lie between each pair of cuts.

10. The retainer post of claim 1 wherein said reservoir means comprises a cavity disposed within said neck section.

11. The retainer post of claim 10 wherein said cavity is open to the outside of said body.

12. The retainer post of claim 1 wherein said bursting means comprises a shape memory effect alloy that expands with an increase in temperature.

13. The retainer post of claim 12 wherein said alloy is a nitinol alloy.

14. The retainer post of claim 1 wherein said bursting means comprises two materials having substantially different thermal coefficients of expansion, the material having the smaller thermal coefficient of expansion coating the material having the larger thermal coefficient of expansion.

15. The retainer post of claim 1 wherein said bursting means expands with sufficient pressure to expand said neck section at a temperature increase to no more than about 450° F.

16. The retainer post of claim 1 wherein said shoulder section means comprises means for engaging a fastener.

17. The retainer post of claim 1 wherein said shoulder section means includes at least part of the packaging of such an electrical device.

18. The retainer post of claim 1 wherein said shoulder section means is joined to the packaging of such an electrical device.

19. The retainer post of claim 2 wherein said retaining means is of such a shape that upon the expansion of said neck section there tends to be a pivot of said retaining means such that its distal edge engages the underside of such circuit board and pulls said shoulder section means toward the top or opposite surface of such board.

* * * * *

UNITED STATES PATENT AND TRADEMARK OFFICE
CERTIFICATE OF CORRECTION

PATENT NO. : 4,841,100

DATED : June 20, 1989

INVENTOR(S) : Martin G. Ignasiak

It is certified that error appears in the above-indentified patent and that said Letters Patent is hereby corrected as shown below:

Title page, item [56],
References Cited: Foreign patent, No. 68764, dated 2/28, 411/42 should be included.
Column 3, Line 11, "Embodiment comprises" should read --embodiment of an expansion means comprises--.

Column 3, Line 33, "the bursting" should read --The bursting--.

Column 3, Line 40, "they alloy" should read --the alloy--.

Column 4, Line 13, "4A - 4A'" should read --4A - 4A--.

Column 5, Line 52, "mmay" should read --may--.

Column 6, Line 65, "needs to be" should read --tends to be--.

UNITED STATES PATENT AND TRADEMARK OFFICE
CERTIFICATE OF CORRECTION

PATENT NO. : 4,841,100

DATED : June 20, 1989

INVENTOR(S) : Martin G. Ignasiak

It is certified that error appears in the above-indentified patent and that said Letters Patent is hereby corrected as shown below:

Column 8, lines 1 and 2, "insertable in a printed" should read -- insertable in a hole in a printed --.

Signed and Sealed this

Twenty-fourth Day of January, 1995

Attest:

BRUCE LEHMAN

*Attesting Officer*    *Commissioner of Patents and Trademarks*